(12) United States Patent
Ishida et al.

(10) Patent No.: US 10,916,520 B2
(45) Date of Patent: Feb. 9, 2021

(54) SEMICONDUCTOR DEVICE, AND METHOD OF MANUFACTURING THE SAME

(71) Applicant: Mitsubishi Electric Corporation, Tokyo (JP)

(72) Inventors: Kiyoshi Ishida, Tokyo (JP); Makoto Kimura, Tokyo (JP); Katsumi Miyawaki, Tokyo (JP); Yukinobu Tarui, Tokyo (JP); Keiko Shirafuji, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/575,522

(22) PCT Filed: Jun. 1, 2016

(86) PCT No.: PCT/JP2016/066155
§ 371 (c)(1),
(2) Date: Nov. 20, 2017

(87) PCT Pub. No.: WO2016/199634
PCT Pub. Date: Dec. 15, 2016

(65) Prior Publication Data
US 2018/0158794 A1    Jun. 7, 2018

(30) Foreign Application Priority Data

Jun. 10, 2015 (JP) .................... 2015-117505

(51) Int. Cl.
*H01L 23/00* (2006.01)
*H01L 23/055* (2006.01)
(Continued)

(52) U.S. Cl.
CPC .............. *H01L 24/48* (2013.01); *H01L 21/50* (2013.01); *H01L 23/04* (2013.01); *H01L 23/055* (2013.01);
(Continued)

(58) Field of Classification Search
CPC ........... H01L 23/552; H01L 2924/3025; H01L 2224/97; H01L 23/053; H01L 23/04;
(Continued)

(56) References Cited

U.S. PATENT DOCUMENTS 5,532,514 A * 7/1996 Kozono ................ H01L 23/057
257/701
5,795,190 A * 8/1998 Ono ...................... H01R 12/721
439/159

(Continued)

FOREIGN PATENT DOCUMENTS

JP    2008-283150 A    11/2008
JP    2011-114192 A    6/2011
(Continued)

OTHER PUBLICATIONS

International Search Report (PCT/ISA/210) dated Aug. 9, 2016, by the Japanese Patent Office as the International Searching Authority for International Application No. PCT/JP2016/066155.
(Continued)

*Primary Examiner* — Jarrett J. Stark
(74) *Attorney, Agent, or Firm* — Buchanan Ingersoll & Rooney PC

(57) ABSTRACT

A semiconductor device includes a substrate, a semiconductor element, a ground pad, an insulating coating member, a conductive bonding member, and a conductive cap. The inner peripheral end of a bottom of the conductive cap is disposed at a side close to the inner periphery of the insulating coating member relative to the outer peripheral
(Continued)

end of the insulating coating member. The bottom has a shape in which the distance between the main surface and itself decreases continuously from its outer peripheral end toward its inner peripheral end.

10 Claims, 8 Drawing Sheets

(51) Int. Cl.
*H01L 21/50* (2006.01)
*H01L 23/10* (2006.01)
*H01L 23/04* (2006.01)

(52) U.S. Cl.
CPC .............. *H01L 23/10* (2013.01); *H01L 24/73* (2013.01); *H01L 2224/4807* (2013.01); *H01L 2224/48095* (2013.01); *H01L 2224/48227* (2013.01); *H01L 2924/00014* (2013.01); *H01L 2924/163* (2013.01); *H01L 2924/1631* (2013.01); *H01L 2924/16152* (2013.01); *H01L 2924/3025* (2013.01)

(58) Field of Classification Search
CPC ......... H01L 23/49838; H01L 23/49894; H01L 21/52; H05K 1/181; H05K 1/111
See application file for complete search history.

(56) References Cited

U.S. PATENT DOCUMENTS

| | | | | |
|---|---|---|---|---|
| 2003/0197195 | A1* | 10/2003 | Shim, II | H01L 23/10 257/200 |
| 2005/0168952 | A1* | 8/2005 | Chen | H01L 23/04 361/704 |
| 2007/0114620 | A1* | 5/2007 | Fujii | B81B 7/007 257/414 |
| 2010/0200983 | A1* | 8/2010 | Ono | H01L 23/055 257/708 |
| 2011/0127655 | A1* | 6/2011 | Fujii | H01L 23/04 257/664 |
| 2012/0139111 | A1* | 6/2012 | Ono | B81C 1/00269 257/741 |
| 2014/0083735 | A1* | 3/2014 | Kohda | H03H 9/21 174/50.5 |
| 2014/0183671 | A1* | 7/2014 | Kuratani | H01L 23/552 257/416 |

FOREIGN PATENT DOCUMENTS

| | | |
|---|---|---|
| JP | 2011-222693 A | 11/2011 |
| JP | 2013-9280 A | 1/2013 |
| JP | 5277755 B2 | 8/2013 |
| JP | 2014-60216 A | 4/2014 |
| WO | WO 2012/128210 A1 | 9/2012 |

OTHER PUBLICATIONS

Written Opinion (PCT/ISA/237) dated Aug. 9, 2016, by the Japanese Patent Office as the International Searching Authority for International Application No. PCT/JP2016/066155.

Notification of Reasons for Refusal dated Nov. 27, 2018, in corresponding Japanese Patent Application No. 2017-523600, and an English machine translation thereof.

Notification of Reasons for Refusal dated May 8, 2018 in corresponding Japanese Patent Application No. 2017-523600, and an English machine translation thereof.

Office Action dated Apr. 30, 2020, by the British Patent Office in corresponding British Patent Application No. GB1719387.1. (3 pages).

* cited by examiner

SEMICONDUCTOR DEVICE, AND METHOD OF MANUFACTURING THE SAME

TECHNICAL FIELD

The present invention relates to a semiconductor device and a method of manufacturing the same, and particularly, to a semiconductor device including a conductive cap covering a semiconductor element and a method of manufacturing the semiconductor device.

BACKGROUND ART

In one semiconductor device, a semiconductor element packaged on the main surface of a substrate is covered with a conductive cap. This conductive cap is bonded to a ground pad provided on the main surface so as to surround the semiconductor element, using a conductive bonding member. Such a structure can shield an electric field outside the conductive cap, thereby protecting the semiconductor element inside the conductive cap.

In the above semiconductor device, the conductive bonding member may flow out to the inside of the conductive cap and short-circuit the semiconductor element and a signal pad, or the conductive bonding member may be scattered to the inside of the conductive cap and break a bonding wire.

A semiconductor device including a structure for restricting a conductive bonding member from flowing to the inside of a conductive cap is disclosed in, for example, PTD 1 (Japanese Patent No. 5277755). In this semiconductor device, the inner peripheral side of a bonding pad (ground electrode) is covered with a solder resist (coating member). A pressing portion of the conductive cap is disposed on the upper surface of the solder resist. Holding back the conductive bonding member by the solder resist accordingly restricts the conductive bonding member from flowing to the inside of the conductive cap.

CITATION LIST

Patent Documents

PTD 1: Japanese Patent No. 5277755

SUMMARY OF INVENTION

Technical Problem

In the semiconductor device described in the above patent document, however, the conductive bonding member may pass between the upper surface of the solder resist and the pressing portion of the conductive cap and flow to the inside of the conductive cap. The semiconductor device described in the above patent document thus fails to sufficiently restrict the conductive bonding member from flowing to the inside of the conductive cap.

The present invention has been made in view of the above problem, and has an object to provide a semiconductor device that can sufficiently restrict a conductive bonding member from flowing to the inside of the conductive cap and a method of manufacturing the semiconductor device.

Solution to Problem

A semiconductor device of the present invention includes a substrate, a semiconductor element, a ground pad, an insulating coating member, a conductive bonding member, and a conductive cap. The substrate has a main surface. The semiconductor element is packaged on the main surface. The ground pad is provided on the main surface so as to surround the semiconductor element. The insulating coating member is provided to expose an outer peripheral side of the ground pad, cover an inner peripheral side of the ground pad, and form a step from over the ground pad to over the substrate. The conductive bonding member is disposed at the outer peripheral side of the ground pad. The conductive cap is bonded to the ground pad with the conductive bonding member so as to cover the semiconductor element. An inner peripheral end of a bottom of the conductive cap is disposed at a side close to an inner periphery of the insulating coating member relative to an outer peripheral end of the insulating coating member. The bottom has a shape in which a distance between the main surface and the bottom decreases continuously from an outer peripheral end of the bottom toward the inner peripheral end of the bottom.

Advantageous Effects of Invention

According to the semiconductor device of the present invention, the inner peripheral end of the bottom of the conductive cap is disposed at the side close to the inner periphery of the insulating coating member relative to the outer peripheral end of the insulating coating member, and thus, the insulating coating member can hold back the conductive bonding member. The bottom has a shape in which the distance between the main surface and the bottom decreases continuously from its outer peripheral end to its inner peripheral end, and thus, the conductive bonding member can be squeezed out toward the outer peripheral end of the conductive cap by the shape of the bottom. Therefore, the conductive bonding member can be sufficiently restricted from flowing to the inside of the conductive cap.

DESCRIPTION OF EMBODIMENTS

Figure 1:
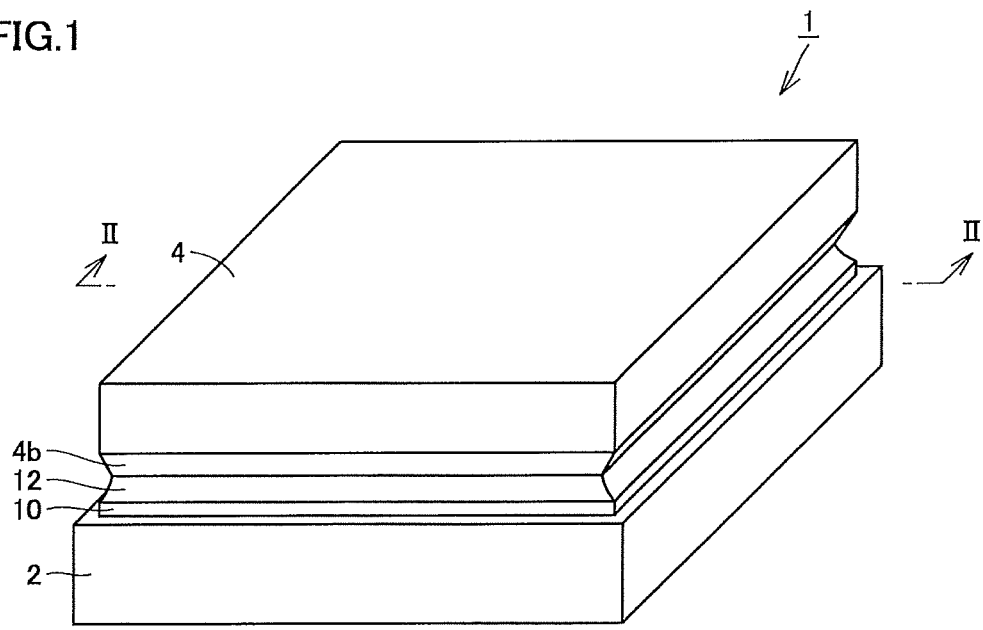
FIG. 1 is a perspective view schematically showing a configuration of a semiconductor device of Embodiment 1 of the present invention.

Embodiments of the present invention will be described below with reference to the drawings.

Embodiment 1

A configuration of a semiconductor device 1 of Embodiment 1 of the present invention will be described first with reference to FIGS. 1 to 3. Mainly referring to FIGS. 1 and 2, semiconductor device 1 of the present embodiment mainly includes a printed wiring board 2, a semiconductor element 3, a conductive cap 4, bonding wires 6, a conductive bonding member 12, and an insulating coating member 13. In semiconductor device 1, the space above semiconductor element 3 packaged on a main surface S1 of substrate 2a, which will be described below, is covered with conductive cap 4.

Figure 2:
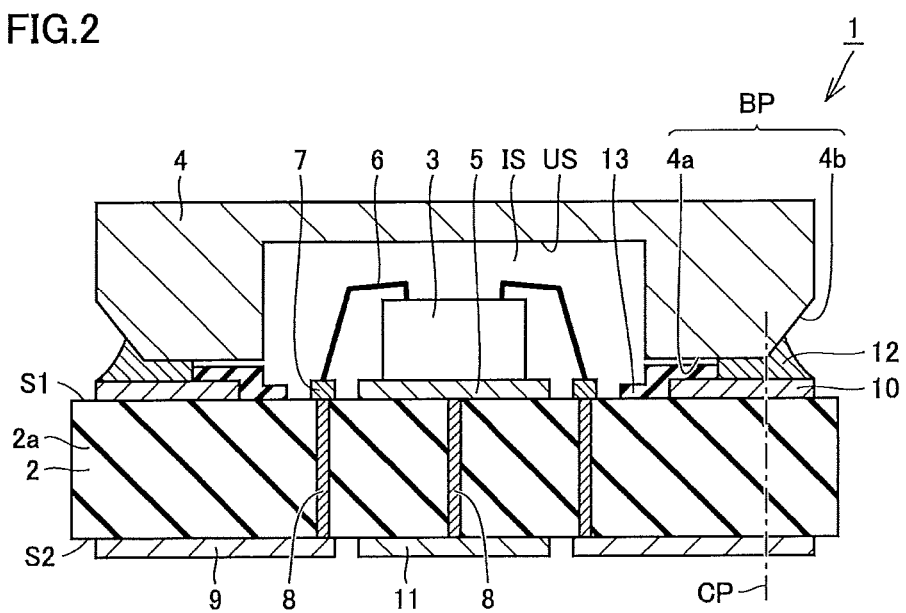
FIG. 2 is a sectional view taken along the line II-II of FIG. 1.

Mainly referring to FIG. 2, printed wiring board 2 is formed of, for example, a glass-epoxy-resin-based double-sided printed wiring board. Printed wiring board 2 mainly includes a substrate 2a, a die attach pad 5, signal pads 7, vias 8, a signal electrode 9, a ground pad 10, and a ground electrode 11.

Substrate 2a of the present embodiment is an insulating plate. Substrate 2a has a main surface (upper surface) S1 and the other surface (lower surface) S2 opposite to main surface S1. Main surface S1 and the other surface S2 are opposite to each other in the thickness direction of substrate 2a. Die attach pad 5, signal pads 7, and ground pad 10 are provided on main surface S1. Signal electrode 9 and ground electrode 11 are provided on the other surface S2.

Die attach pad 5, signal pads 7, vias 8, signal electrode 9, ground pad 10, and ground electrode 11 are each conductive. In the present embodiment, die attach pad 5, signal pads 7, signal electrode 9, ground pad 10, and ground electrode 11 are each formed by etching copper foils attached to the opposite surfaces of substrate 2a.

Via 8 is formed to pass through main surface S1 and the other surface S2 of substrate 2a. Signal pad 7 is electrically connected to signal electrode 9 through via 8. Die attach pad 5 is electrically connected to ground electrode 11 through via 8. Ground pad 10 is also electrically connected to ground electrode 11 through a via (not shown).

Figure 3:
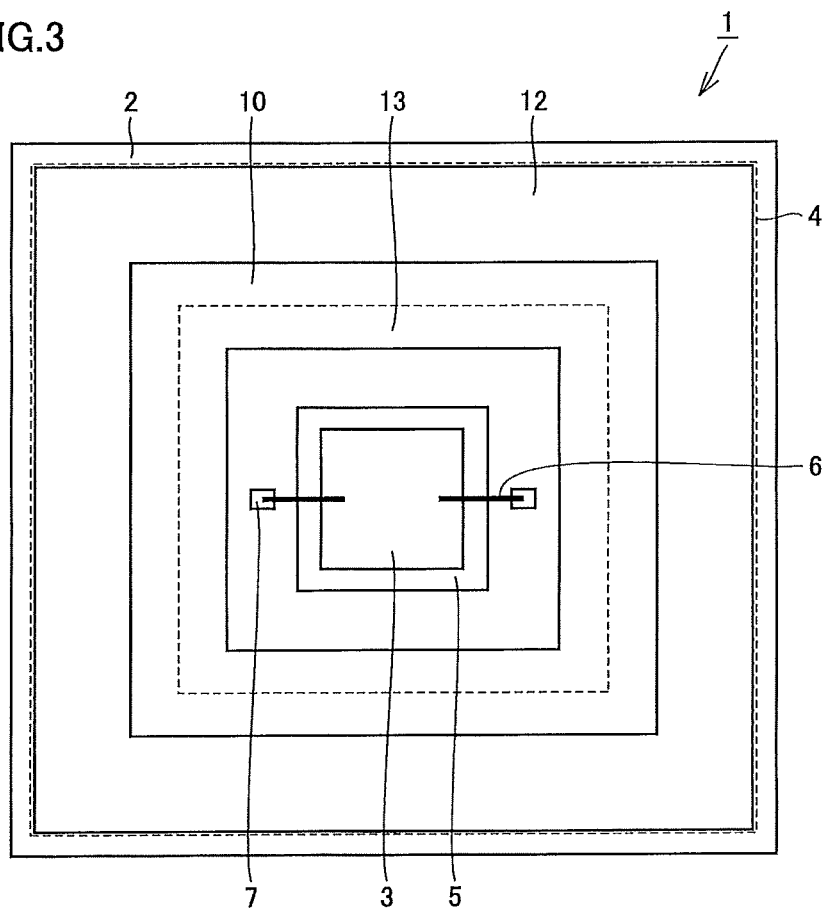
FIG. 3 is a top view of the semiconductor device of FIG. 1.

Mainly referring to FIGS. 1 and 3, ground pad 10 is disposed at the outer peripheral side of substrate 2a. For easy viewing, conductive cap 4 is indicated by a broken line in FIG. 3. Ground pad 10 is disposed over the entire periphery at the outer peripheral side of substrate 2a.

Mainly referring to FIGS. 2 and 3, ground pad 10 is provided on main surface S1 so as to surround semiconductor element 3. Ground pad 10 is formed to surround die attach pad 5 and signal pads 7. Signal pads 7 are disposed at the side close to the outer periphery of substrate 2a relative to die attach pad 5. Signal pads 7 are arranged in the vicinity of die attach pad 5.

Insulating coating member 13 is formed to surround die attach pad 5 and signal pads 7. Insulating coating member 13 is insulating. Insulating coating member 13 is formed along the entire periphery of ground pad 10. Insulating coating member 13 is formed to expose the outer peripheral side of ground pad 10. Insulating coating member 13 is formed to surround the inner peripheral side of ground pad 10. Insulating coating member 13 is provided to form a step from over ground pad 10 to over substrate 2a.

In the present embodiment, substrate 2a is exposed in the region inside ground pad 10 where die attach pad 5 or signal pads 7 are not formed. Alternatively, ground pad 10 may be formed up to the inside of insulating coating member 13.

Insulating coating member 13 is, for example, a solder resist. Insulating coating member 13 is applied onto the surface of substrate 2a with a uniform thickness by screen printing or spraying and then heated to be cured.

Semiconductor element 3 is, for example, a high-frequency element that amplifies an input signal. Semiconductor element 3 is packaged on main surface S1 of substrate 2a. Specifically, semiconductor element 3 is packaged on die attach pad 5 provided on main surface S1 with a die bonding adhesive (not shown). The die bonding adhesive may be, for example, a conductive silver paste containing minute silver particles dispersed in a liquid epoxy resin, or a silicone adhesive that keeps flexibility even when cured.

Semiconductor element 3 is connected to signal pads 7 by bonding wires 6. As a result, semiconductor element 3 is conducting with signal electrode 9 provided on the other surface S2 of substrate 2a via bonding wires 6, signal pads 7, and vias 8.

A plurality of semiconductor elements 3 or other electrical and electronic components may be packaged on main surface S1 of substrate 2a. Further, a pad of copper foil may be designed freely as appropriate in accordance with the forms of semiconductor elements or electrical and electronic components to be packaged.

Conductive cap 4 is boned to ground pad 10 with conductive bonding member 12 so as to cover semiconductor element 3. Conductive cap 4 has electrical conductivity. Conductive cap 4 is formed into a cap by, for example, processing a copper alloy having a coefficient of linear expansion close to that in the planar direction of printed wiring board 2. The surface of conductive cap 4 is plated.

Conductive cap 4 has a space IS for housing semiconductor element 3, bonding wires 6, and the like on a lower surface US of conductive cap 4. In the present embodiment, space IS is airtight, with conductive cap 4 bonded to ground pad 10. Semiconductor element 3 is accordingly housed in conductive cap 4 airtightly.

At the outer peripheral side of lower surface US of conductive cap 4, a bottom BP is provided. The inner peripheral end of bottom BP of conductive cap 4 is disposed at the side close to the inner periphery of insulating coating member 13 relative to the outer peripheral end of insulating coating member 13. Bottom BP has a shape in which the distance between main surface S1 and itself decreases continuously from its outer peripheral end toward its inner peripheral end.

Specifically, bottom BP has a bottom surface portion 4a and a tapered portion 4b. Bottom surface portion 4a and tapered portion 4b are each provided over the entire periphery at the outer peripheral side of lower surface US of conductive cap 4. Bottom surface portion 4a that is a level surface is provided at the inner peripheral side of bottom BP. Tapered portion 4b is provided at the outer peripheral side of bottom surface portion 4a. This tapered portion 4b has a shape in which the distance between main surface S1 and itself decreases continuously from the outer peripheral end of bottom BP toward the inner peripheral end of bottom BP.

The angle formed between tapered portion 4b and the level surface is, for example, 45 degrees. Conductive cap 4 of the present embodiment is formed by cutting. This leads to smaller variations in dimension than those in the case of pressing.

A plating on the surface of conductive cap 4 may be formed of a plurality of layers. The plating formed of a plurality of layers may be, for example, a three-layer plating of copper, nickel, and gold, or a four-layer plating of copper, nickel, palladium, and gold, with copper serving as an underlying layer. Alternatively, the surface of a one-layer plating of copper may be subjected to an organic solderbility preservative (OSP) process for forming a film of organic corrosion inhibitor, for example, imidazole.

Conductive cap 4 is disposed over substrate 2a so as to cover semiconductor element 3 and the like. Part of bottom surface portion 4a and part of tapered portion 4b are mechanically fixed to ground pad 10 by conductive bonding member 12 and are also electrically connected thereto. This provides conductive cap 4 with the same potential (ground potential) as that of ground electrode 11 on the other surface S2.

Part of bottom surface portion 4a of conductive cap 4 is located above part of insulating coating member 13. Conductive cap 4 is lifted by the surface tension of conductive bonding member 12. Bottom surface portion 4a of conductive cap 4 is in slight contact with the insulating coating member 13 or has a slight gap between insulating coating member 13 and itself.

Conductive bonding member 12 is disposed at the outer peripheral side of ground pad 10. Conductive bonding member 12 is disposed over the entire periphery at the outer peripheral side of ground pad 10. Conductive bonding member 12 has electrical conductivity. Conductive bonding member 12 may be, for example, tin-silver-copper solder.

The end at the inner peripheral side of tapered portion 4b of conductive cap 4 coincides with the end at the outer peripheral side of bottom surface portion 4a. The end at the inner peripheral side of tapered portion 4b of conductive cap 4 is disposed directly above a center CP of the region (bonding region) at the outer peripheral side of ground pad 10 that is exposed from insulating coating member 13. The end at the inner peripheral side of tapered portion 4b may be disposed directly above center CP of the region (bonding region) at the outer peripheral side of ground pad 10 that is exposed from insulating coating member 13, or at the side close to the inner periphery of ground pad 10 relative to the portion directly above center CP. This center CP is a position at which the distance between the outer peripheral end of insulating coating member 13 and the end at the outer peripheral side of ground pad 10 is divided equally.

The end at the outer peripheral side of tapered portion 4b is disposed directly above the end at the outer peripheral side of ground pad 10. For easy viewing, the end at the outer peripheral side of conductive cap 4 is outside the end at the outer peripheral side of ground pad 10 in FIG. 3. The end at the outer peripheral side of ground pad 10 may be disposed directly below the end at the outer peripheral side of conductive cap 4, or at the side close to the inner periphery of conductive cap 4 relative to the portion directly below the end at the outer peripheral side of conductive cap 4.

Description has been given of the case in which semiconductor element 3 is housed in conductive cap 4 airtightly. Semiconductor device 1 may have a sealed structure or a non-sealed structure depending on the type of semiconductor element 3. In other words, semiconductor element 3 may be housed in conductive cap 4 non-airtightly.

Figure 4:
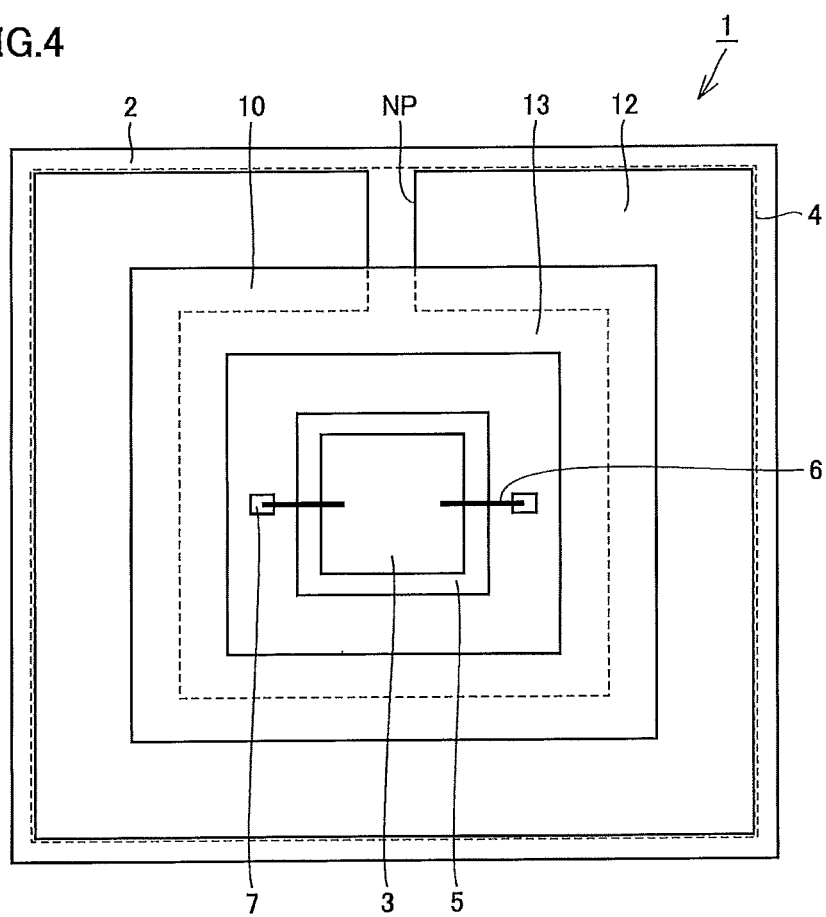
FIG. 4 is a top view schematically showing a configuration of a semiconductor device of a modification of Embodiment 1 of the present invention.

Referring to FIG. 4, a cut-away portion NP is provided in part of ground pad 10 in a semiconductor device 1 of a modification of the present embodiment. This allows the outside and inside of conductive cap 4 to communicate with each other through cut-away portion NP. Semiconductor element 3 is accordingly housed in conductive cap 4 non-airtightly.

Referring to FIGS. 2 and 5 to 9, a method of manufacturing the semiconductor device of the present embodiment will now be described. FIGS. 5 to 9 are sectional views at the same sectional position as that of FIG. 2.

Figure 5:
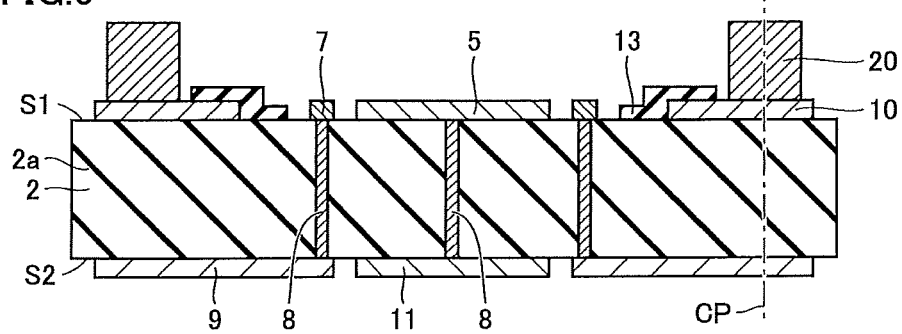
FIG. 5 is a schematic sectional view showing one step of a method of manufacturing the semiconductor device of Embodiment 1 of the present invention.

Referring to FIG. 5, a printed wiring board 2 is prepared first. A paste 20 is applied to printed wiring board 2. Paste 20 is a mix of a powdered conductive bonding member 12 and flux that can reduce an oxide film on its surface. By screen printing, paste 20 is applied to the region (bonding region) at the outer peripheral side of a ground pad 10 provided on a main surface S1 of a substrate 2a exposed from an insulating coating member 13. It is desirable that in this application, paste 20 is applied so as not to protrude from the region at the outer peripheral side of ground pad 10 that is exposed from insulating coating member 13. In this manner, conductive bonding member 12 is provided to the region (bonding region) at the outer peripheral side of ground pad 10 that is exposed from insulating coating member 13.

Figure 6:
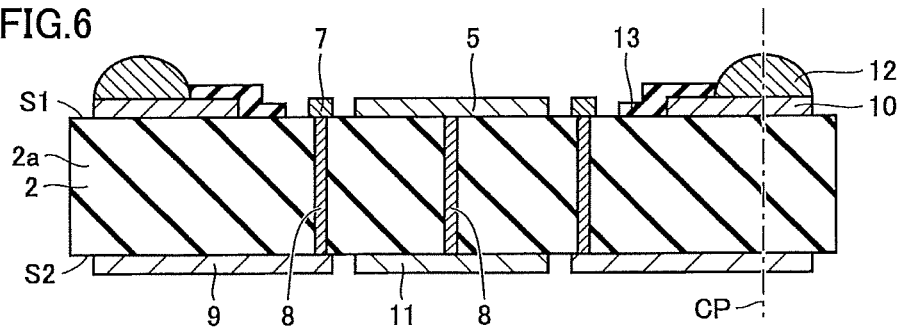
FIG. 6 is a schematic sectional view showing a step following the step shown in FIG. 5.

Referring to FIG. 6, by a reflow process, conductive bonding member 12 is subsequently melted to be integrated with ground pad 10. Then, by immersion cleaning, the flux contained in paste 20 is dissolved and removed. In this manner, conductive bonding member 12 is melted in the region (bonding region) at the outer peripheral side of ground pad 10 exposed from insulating coating member 13.

Conductive bonding member 12 wet-spreads to the region (bonding region) at the outer peripheral side of ground pad 10 that is exposed from insulating coating member 13, and by its surface tension, takes on such a shape that bulges round upwardly of center CP of the bonding region. In other words, the vertex of conductive bonding member 12 is located at center CP.

Figure 7:
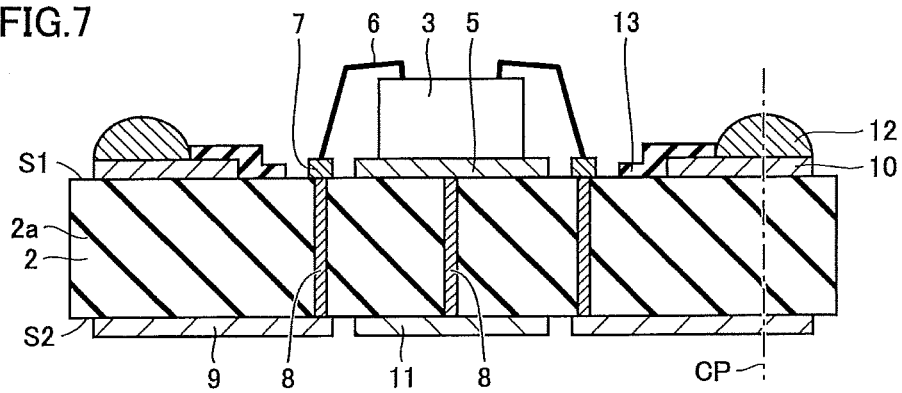
FIG. 7 is a schematic sectional view showing a step following the step shown in FIG. 6.

Referring to FIG. 7, semiconductor element 3 is subsequently packaged on substrate 2a. Specifically, semiconductor element 3 is mounted on a die attach pad 5 supplied with a conductive adhesive (die bonding adhesive) by a transferring process. The die bonding adhesive is cured through heating in this state. The bonding wires are connected to semiconductor element 3 and signal pads 7 by ball bonding.

Figure 8:
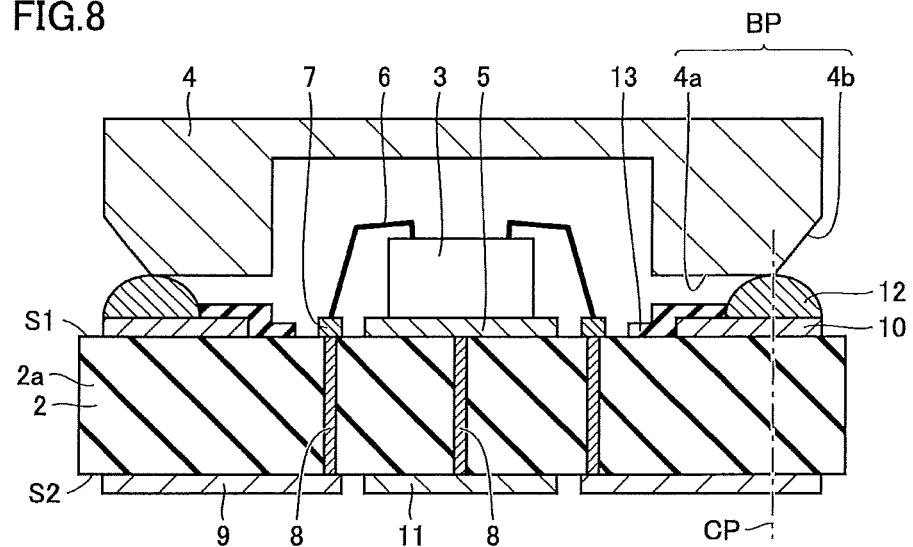
FIG. 8 is a schematic sectional view showing a step following the step shown in FIG. 7.

Referring to FIG. 8, a conductive cap 4 is subsequently mounted above substrate 2a. The end at the inner peripheral side of a tapered portion 4b of conductive cap 4 is disposed directly above center CP of the bonding region of ground pad 10, or at the side close to the inner periphery of ground pad 10 relative to the portion immediately above center CP. Thus, the vertex portion of conductive bonding member 12 having the shape that bulges round by the surface tension contacts the end at the inner peripheral side of tapered portion 4b. In this manner, the conductive cap in which the inner peripheral end of bottom BP having tapered portion 4b is disposed at the side close to the inner periphery of insulating coating member 13 relative to the outer peripheral end of insulating coating member 13 is mounted on the melted conductive bonding member 12.

On this occasion, substrate 2a and conductive cap 4 may be heated to a temperature at which conductive bonding member 12 does not melt, and then, conductive cap 4 may be mounted while being pressurized. In this case, when being pressed against conductive bonding member 12, conductive cap 4 contacts conductive bonding member 12, in the narrow region of the vertex portion of conductive bonding member 12. This results in pressure welding at high pressure, preventing easy occurrence of a positional shift in later handling.

Figure 9:
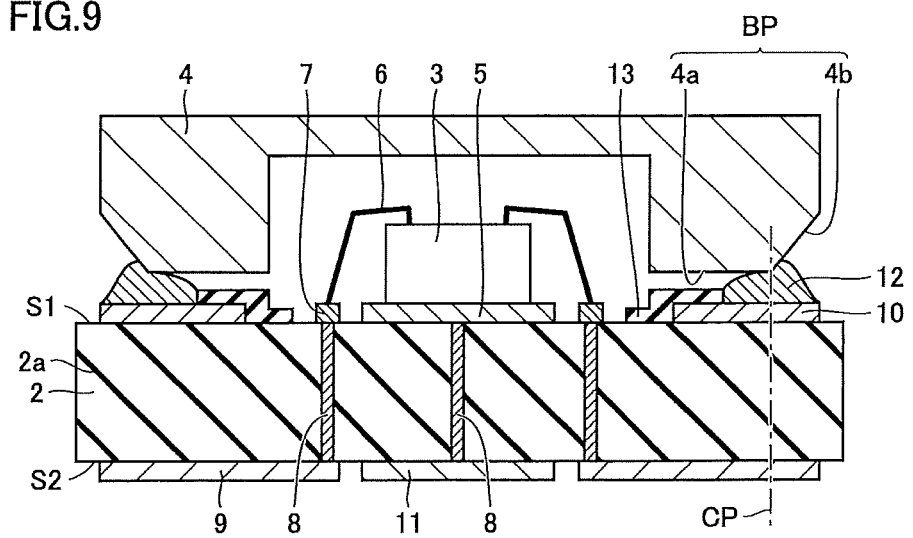
FIG. 9 is a schematic sectional view showing how a conductive cap squeezes out a conductive bonding member in the step shown in FIG. 7.

Referring to FIG. 9, when conductive bonding member 12 is melted through further heating, conductive bonding member 12 is squeezed out toward the outer periphery of substrate 2a by tapered portion 4b of conductive cap 4, preventing conductive bonding member 12 from flowing to the inside of conductive cap 4.

Alternatively, substrate 2a and conductive cap 4 may be heated to a temperature at which conductive bonding member 12 melts, and then, conductive cap 4 may be mounted. In this case, a speed at which conductive cap 4 is pressed against the melted conductive bonding member 12 can be selected freely, so that conductive bonding member 12 can be squeezed out uniformly toward the outer periphery of substrate 2a.

As shown in FIG. 2, finally, a semiconductor device 1 is obtained, in which the space above semiconductor element 3 packaged on main surface S1 of substrate 2a is covered with conductive cap 4.

The operation and effect of the present embodiment will now be described in comparison with those of semiconductor devices of comparative examples.

As the semiconductor devices of the comparative examples, a semiconductor device of Comparative Example 1 will be described with reference to FIG. 10, and a semiconductor device of Comparative Example 2 will be described with reference to FIG. 11. In Comparative Example 1 and Comparative Example 2, the same components will hereinafter be denoted by the same reference signs as those of Embodiment 1, and description thereof will not be repeated, unless otherwise noted.

Figure 10:
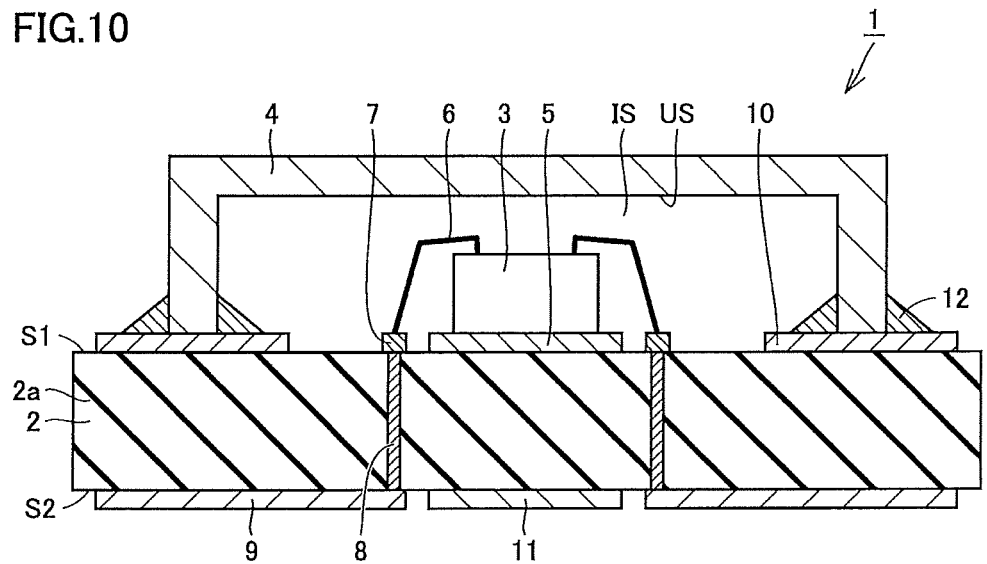
FIG. 10 is a sectional view schematically showing a configuration of a semiconductor device of Comparative Example 1.

Referring to FIG. 10, a semiconductor device 1 of Comparative Example 1 differs from semiconductor device 1 of the present embodiment mainly in that it includes no insulating coating member 13. In semiconductor device 1 of Comparative Example 1, a conductive bonding member 12 cannot be held back by an insulating coating member 13. Thus, conductive bonding member 12 may flow to the inside of a conductive cap 4 and short-circuit a semiconductor element 3 and signal pads 7, or conductive bonding member 12 may disperse to the inside of conductive cap 4 and break bonding wires 6.

Figure 11:
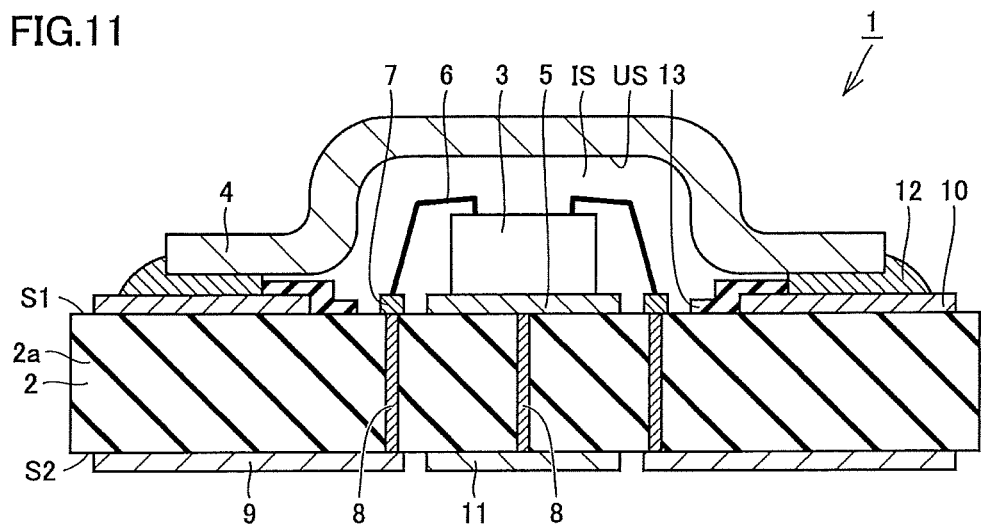
FIG. 11 is a sectional view schematically showing a configuration of a semiconductor device of Comparative Example 2.

Referring to FIG. 11, a semiconductor device 1 of Comparative Example 2 differs from semiconductor device 1 of the present embodiment mainly in that the bottom of a conductive cap 4 does not have a shape in which the distance between a main surface S1 and itself decreases continuously from its outer peripheral end toward its inner peripheral end. In semiconductor device 1 of Comparative Example 2, a conductive bonding member 12 may pass between the upper surface of an insulating coating member 13 and conductive cap 4 and flow to the inside of conductive cap 4. This fails to sufficiently restrain conductive bonding member 12 from flowing to the inside of conductive cap 4.

In semiconductor device 1 of Comparative Example 2, conductive bonding member 12 is held back by insulating coating member 13, so that conductive bonding member 12 is more likely to flow to the outside of conductive cap 4. Thus, the end at the outer peripheral side of a ground pad 10 is formed to be located outside the outer peripheral end of conductive cap 4, resulting in an increase in the size of substrate 2a. Semiconductor device 1 thus cannot be downsized.

According to semiconductor device 1 of the present embodiment, the inner peripheral end of bottom BP of conductive cap 4 is disposed at the side close to the inner periphery of insulating coating member 13 relative to the outer peripheral end of insulating coating member 13, thus allowing insulating coating member 13 to hold back conductive bonding member 12. Since bottom BP has a shape (tapered portion 4b) in which the distance between main surface S1 and itself decreases continuously from its outer peripheral end toward its inner peripheral end, and thus, conductive bonding member 12 can be squeezed out toward the outer peripheral end of conductive cap 4 by tapered portion 4b of bottom BP. This can sufficiently prevent conductive bonding member 12 from flowing to the inside of conductive cap 4.

Conductive cap 4 is bonded to ground pad 10 with conductive bonding member 12 so as to cover semiconductor element 3. Thus, an external electric field can be cut off by conductive cap 4, thereby protecting the semiconductor element 3 inside the conductive cap 4. Further, semiconductor element 3 is surrounded by conductive cap 4 and ground electrode 11, and conductive bonding member 12 allows conductive cap 4 to be conducting with ground pad 10. The space surrounded by the conductor with a ground potential is accordingly defined around semiconductor element 3, so that an external electric field is cut off. This can protect semiconductor element 3 from external electromagnetic noise more effectively.

Tapered portion 4b can allow conductive bonding member 12 having a sufficient thickness to be disposed below tapered portion 4b. This allows substrate 2a and conductive cap 4 to be firmly bonded together with conductive bonding member 12 without increasing the size of ground pad 10 toward the outer peripheral side, resulting in a smaller size of semiconductor device 1.

In semiconductor device 1 of the present embodiment, the end at the inner peripheral side of the shape (tapered portion 4b) in which the distance between main surface S1 and the bottom BP decreases continuously from the outer peripheral end of bottom BP toward the inner peripheral end of bottom BP is disposed immediately above center CP of the region (bonding region) at the outer peripheral side of ground pad 10 that is exposed from insulating coating member 13, or at the side close to the inner periphery of ground pad 10 relative to the portion immediately above center CP. When conductive bonding member 12 wet-spreads to the bonding region, the vertex of conductive bonding member 12 is located at center CP of the bonding region. The end at the inner peripheral side of tapered portion 4b can thus contact the vertex of conductive bonding member 12 or the side close to the inner periphery relative to the vertex. Thus, conductive bonding member 12 can be effectively squeezed out toward the outer peripheral end by tapered portion 4b of bottom BP.

In semiconductor device 1 of the present embodiment, the end at the outer peripheral side of ground pad 10 is disposed directly below the end at the outer peripheral side of conductive cap 4, or at the side close to the inner periphery of conductive cap 4 relative to the portion directly below the end at the outer peripheral side of conductive cap 4. The end at the outer peripheral side of ground pad 10 can accordingly be disposed at the side close to the inner periphery of conductive cap 4 relative to the end at the outer peripheral side of conductive cap 4. This leads to a smaller outside shape of substrate 2a, resulting in a smaller size of semiconductor device 1.

A method of manufacturing semiconductor device 1 of the present embodiment is a method of manufacturing a semiconductor device 1 including a semiconductor element 3 packaged on a main surface S1 of a substrate 2a. The method of manufacturing semiconductor device 1 includes the following steps. A conductive bonding member 12 is provided to the region at the outer peripheral side of a ground pad 10 exposed from an insulating coating member 13 that is provided to cover the inner peripheral side of ground pad 10 provided at a position of main surface S1 and to form a step from over ground pad 10 to over substrate 2a, at which ground pad 10 surrounds semiconductor element 3. Conductive bonding member 12 is melted in the region at the outer peripheral side of ground pad 10 that is exposed from insulating coating member 13. A conductive cap 4 in which the inner peripheral end of a bottom BP having a shape, in which the distance between main surface S1 and the bottom BP decreases continuously from the outer peripheral end toward the inner peripheral end, is disposed at the side close to the inner periphery of insulating coating member 13 relative to the outer peripheral end of insulating coating member 13 is mounted on the melted conductive bonding member 12.

According to the method of manufacturing semiconductor device 1 of the present embodiment, insulating coating member 13 can hold back conductive bonding member 12 because the inner peripheral end of bottom BP of conductive cap 4 is located at the side close to the inner periphery of insulating coating member 13 relative to the outer peripheral end of insulating coating member 13. Bottom BP has a shape (tapered portion 4b) in which the distance between main surface S1 and itself decreases continuously from its outer peripheral end toward its inner peripheral end, thus allowing conductive bonding member 12 to be squeezed out to the outer peripheral end by tapered portion 4b of bottom BP. This can sufficiently prevent conductive bonding member 12 from flowing to the inside of conductive cap 4.

In the method of manufacturing semiconductor device 1 of the present embodiment, in the step for mounting conductive cap 4, substrate 2a and conductive cap 4 are heated to a temperature at which conductive bonding member 12 does not melt, and then, conductive cap 4 is mounted while being pressurized. Conductive cap 4 accordingly contacts conductive bonding member 12, in the narrow region of the vertex portion of conductive bonding member 12, resulting in pressure welding at high pressure.

In the method of manufacturing semiconductor device 1 of the present embodiment, in the step for mounting the conductive cap, substrate 2a and conductive cap 4 are heated to a temperature at which conductive bonding member 12 melts, and then, conductive cap 4 is mounted. Thus, a speed at which conductive cap 4 is pressed against the melted conductive bonding member 12 can be selected freely, thus allowing conductive bonding member 12 to be squeezed out uniformly toward the outer periphery of substrate 2a.

Embodiment 2

A semiconductor device of Embodiment 2 of the present invention will be described. In the present embodiment, the same components will hereinafter be denoted by the same reference signs as those of Embodiment 1, and description thereof will not be repeated, unless otherwise noted.

Figure 12:
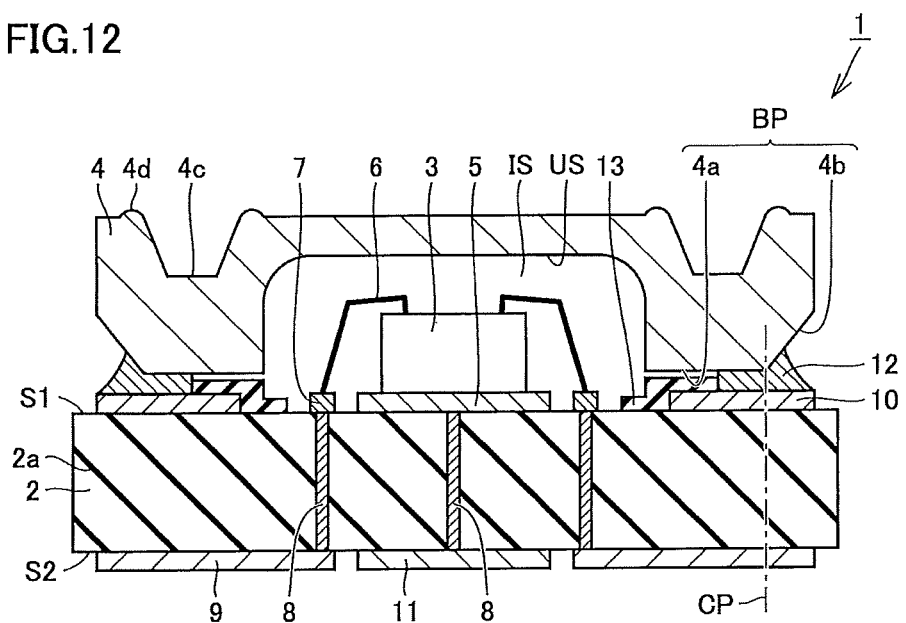
FIG. 12 is a sectional view schematically showing a configuration of a semiconductor device of Embodiment 2 of the present invention.

Referring to FIG. 12, a semiconductor device 1 of the present embodiment differs from semiconductor device 1 of Embodiment 1 mainly in that a recess 4c and a projection 4d are provided in a conductive cap 4.

In semiconductor device 1 of the present embodiment, conductive cap 4 has recess 4c and projection 4d. Recess 4c is provided in the portion opposite to a bottom BP. In other words, recess 4c is provided at the position opposite to bottom BP. Recess 4c is recessed toward bottom BP. Recess 4c is formed to have a smaller opening area toward bottom BP.

Projection 4d is provided at the portion opposite to bottom BP. Projection 4d projects opposite to bottom BP. Projection 4d projects opposite to the direction in which recess 4c is recessed. Projection 4d is provided around recess 4c. Projection 4d is connected to recess 4c. Projection 4d is formed to be continuous from the opening of recess 4c.

Conductive cap 4 is formed into a cap by processing a copper alloy having a coefficient of linear expansion close to that in the planar direction of s printed wiring board 2. In the present embodiment, conductive cap 4 is formed by forging less costly than cutting.

In semiconductor device 1 of the present embodiment, recess 4c is provided in the portion opposite to bottom BP and is recessed toward bottom BP. Accordingly, pressures applied multiple times for forming recess 4c by the upper die of the forging mold are used to firmly press a bottom surface portion 4a and a tapered portion 4b of bottom BP against the lower die of the forging mold. The shape of conductive cap 4 processed in the lower die can be accordingly transferred correctly. Conductive cap 4 that exhibit small dimensional variations compared with cutting and pressing can be obtained.

In semiconductor device 1 of the present embodiment, projection 4d is provided in the portion opposite to bottom BP, projects opposite to bottom BP, and is provided around recess 4c. This allows the member forming conductive cap 4 to release an excessive pressure by a plastic flow to projection 4d when the shapes of bottom surface portion 4a and tapered portion 4b are transferred correctly while forming recess 4c. Damage to the upper die can thus be prevented.

Embodiment 3

A semiconductor device of Embodiment 3 of the present invention will be described. In the present embodiment, the same components will hereinafter be denoted by the same reference signs as those of Embodiment 1, and description thereof will not be repeated, unless otherwise noted.

Figure 13:
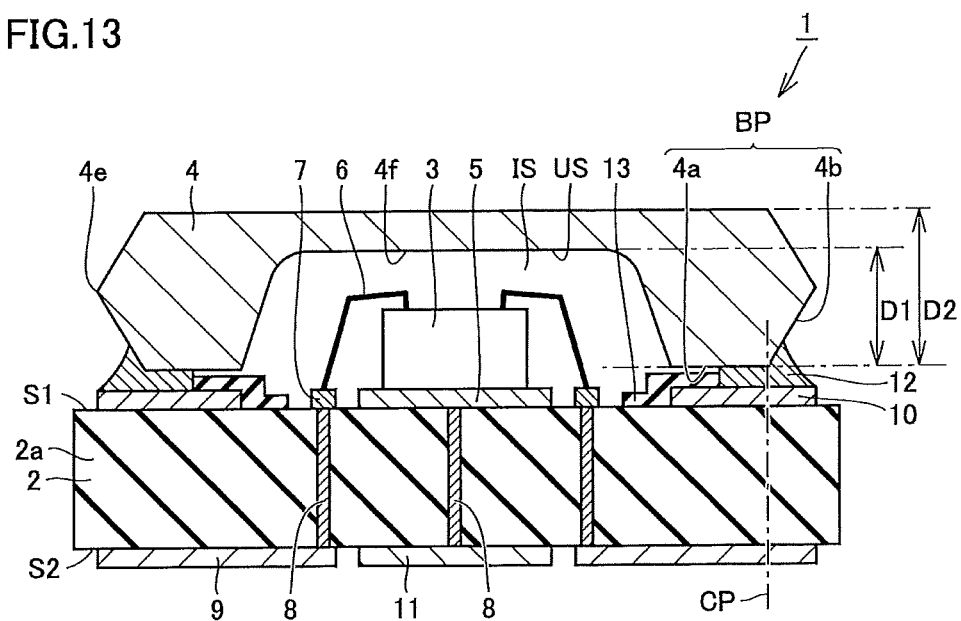
FIG. 13 is a sectional view schematically showing a configuration of a semiconductor device of Embodiment 3 of the present invention.

Referring to FIG. 13, a semiconductor device 1 of the present embodiment differs from semiconductor device 1 of Embodiment 1 mainly in that an outermost projection 4e is provided on the side surface of a conductive cap 4 and that the depth of a ceiling 4f inside conductive cap 4 has a dimension of two-thirds the thickness of conductive cap 4.

In semiconductor device 1 of the present embodiment, conductive cap 4 has outermost projection 4e and ceiling 4f. Outermost projection 4e is provided on the side surface of conductive cap 4. Outermost projection 4e is provided at the center in the thickness direction of conductive cap 4. Outermost projection 4e is formed to project laterally of conductive cap 4. The thickness direction of conductive cap 4 is the direction in which a main surface S1 and the other surface S2 are opposite to each other, with conductive cap 4 bonded to a ground pad 10 with a conductive bonding member 12.

Ceiling 4f covers a semiconductor element 3. Ceiling 4f is disposed to face semiconductor element 3. In the thickness direction of conductive cap 4, a depth D1 from a bottom BP to ceiling 4f has a dimension of two-thirds a thickness D2 of the conductive cap. The thickness direction of conductive cap 4 is the direction in which ceiling 4f and semiconductor element 3 face each other, with conductive cap 4 bonded to ground pad 10 with conductive bonding member 12.

Conductive cap 4 is formed into a cap by processing a copper alloy having a coefficient of linear expansion close to that in the planar direction of a printed wiring board 2. In the present embodiment, conductive cap 4 is formed by etching. In etching of a plate of copper alloy from its opposite surfaces, processing conditions are frequently adjusted so as to dissolve two-thirds of the plate thickness.

In conductive cap 4 of the present embodiment, thickness D1 from bottom BP to ceiling 4f has a dimension of two-thirds thickness D2 of conductive cap 4 in the thickness direction of conductive cap 4. This allows the simultaneous formation of ceiling 4f and outermost projection 4e, reducing a time and effort for processing and an amount of etching liquid used.

Embodiment 4

A semiconductor device of Embodiment 4 of the present invention will be described. In the present embodiment, the same components will hereinafter be denoted by the same reference signs as those of Embodiment 1 and Embodiment 3, and description thereof will not be repeated, unless otherwise noted.

Figure 14:
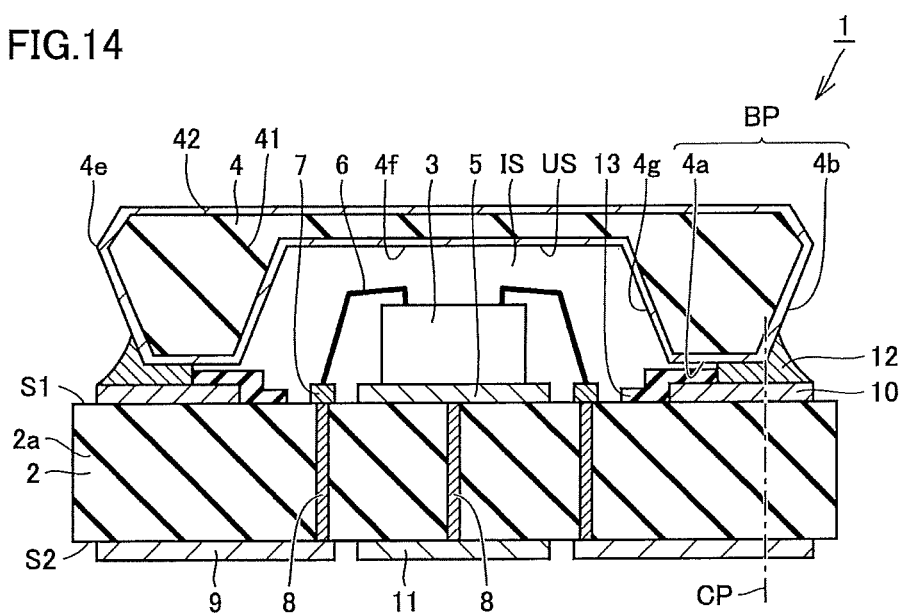
FIG. 14 is a sectional view schematically showing a configuration of a semiconductor device of Embodiment 4 of the present invention.

With reference to FIG. 14, a semiconductor device 1 of the present embodiment differs from semiconductor devices 1 of Embodiment 1 and Embodiment 3 mainly in the configuration of a conductive cap 4.

In semiconductor device 1 of the present embodiment, conductive cap 4 has an outermost projection 4e, a ceiling 4f, and an inner tapered portion 4g. Outermost projection 4e is provided on the side surface of conductive cap 4. Ceiling 4f covers a semiconductor element 3.

Conductive cap 4 has a body portion 41 and a surface portion 42. Surface portion 42 covers the surface of body portion 41. Body portion 41 is formed of resin molding material. Surface portion 42 is formed of conductive material. In the present embodiment, conductive cap 4 is formed of resin molding material having a plated surface. In other words, surface portion 42 is formed by plating. Surface portion 42 may have electrical conductivity, not limited to plating. This resin molding member desirably has a high thermal resistance but not to the point of gasification where a conductive bonding member 12 melts, and has a glass transition temperature of 125° C. or higher.

A bottom BP has a shape in which the distance between a main surface S1 and itself decreases continuously from its inner peripheral end toward ceiling 4f. Inner tapered portion 4g forms this shape. In the thickness direction of conductive cap 4, the distance between bottom BP and outermost projection 4e is equal to the distance between bottom BP and ceiling 4f. In other words, in the thickness direction of conductive cap 4, outermost projection 4e is disposed such that its position coincides with the position of ceiling 4f inside conductive cap 4. The angle of inclination from the inner peripheral end of bottom BP toward ceiling 4f is equal to the angle of inclination from the outer peripheral end of bottom BP toward outermost projection 4e. In other words, the angle of inclination of inner tapered portion 4g of conductive cap 4 is formed to be identical to the angle of inclination of tapered portion 4b.

In semiconductor device 1 of the present embodiment, the positions of outermost projection 4e and ceiling 4f in the thickness direction of conductive cap 4 are aligned with each other, and the angles of inclination of tapered portion 4b and inner tapered portion 4g are aligned with each other. This leads to easy release from the molding die even when bottom surface portion 4a has a small width, allowing the shapes of bottom surface portion 4a and tapered portion 4b to be processed correctly.

The respective embodiments above can be combined as appropriate.

It should be construed that the embodiments disclosed herein are given by way of illustration in all respects, not by way of limitation. It is therefore intended that the scope of the present invention is defined by claims, not only by the embodiments described above, and encompasses all modifications and variations equivalent in meaning and scope to the claims.

REFERENCE SIGNS LIST

1: semiconductor device; 2: printed wiring board; 2a: substrate; 3: semiconductor element; 4: conductive cap; 4a: bottom surface portion; 4b: tapered portion; 4c: recess; 4d: projection; 4e: outermost projection; 4f: ceiling; 4g: inner tapered portion; 5: die attach pad; 6: bonding wire; 7: signal pad; 8: via; 9: signal electrode; 10: ground pad; 11: ground electrode; 12: conductive bonding member; 13: insulating coating member; 20: paste; 41: body portion; 42: surface portion; BP: bottom; CP: center; IS: space; NP: cut-away portion; S1: main surface; S2: the other surface; US: lower surface.

The invention claimed is:

1. A semiconductor device comprising:
a substrate having a main surface;
a semiconductor element packaged on the main surface;
a ground pad provided on the main surface so as to surround the semiconductor element;
an insulating coating member provided to expose an outer peripheral side of the ground pad, cover an inner peripheral side of the ground pad, and form a step from over the ground pad to over the substrate;
a conductive bonding member disposed at the outer peripheral side of the ground pad; and
a conductive cap bonded to the ground pad with the conductive bonding member so as to cover the semiconductor element,
a bottom of the conductive cap having a bottom surface portion, the bottom surface portion having an inner peripheral end being disposed at a side close to an inner periphery of the insulating coating member relative to an outer peripheral end of the insulating coating member,
the bottom of the conductive cap having a tapered portion in which a distance between the main surface and the tapered portion decreases continuously from an outer peripheral end of the tapered portion toward the inner peripheral end of the bottom surface portion,
wherein the bottom surface portion is provided at the inner peripheral side of the bottom of the conductive cap, the tapered portion is provided at the outer peripheral side of the bottom of the conductive cap,
wherein an end at an inner periphery of the tapered portion having the shape in which the distance between the main surface and the bottom decreases continuously from the outer peripheral end of the bottom toward the inner peripheral end of the bottom surface portion is disposed, in plan view, directly above a center of a region of the ground pad exposed from the insulating coating member.

2. The semiconductor device according to claim 1, wherein an end at the outer peripheral side of the ground pad is disposed, in plan view, directly below an end at the outer peripheral side of the conductive cap.

3. The semiconductor device according to claim 1, wherein the conductive cap includes a recess provided in a portion opposite to the bottom surface portion, and the recess is recessed toward the bottom surface portion.

4. The semiconductor device according to claim 3, wherein the conductive cap includes a projection provided in the portion opposite to the bottom surface portion, and the projection projects opposite to the bottom surface portion and is provided around the recess.

5. The semiconductor device according to claim 1, wherein the conductive cap includes an outermost projection provided on a side surface of the conductive cap and a ceiling covering the semiconductor element, the outermost projection is provided at a center in a thickness direction of the conductive cap, and in the thickness direction of the conductive cap, a depth from the bottom to the ceiling has a dimension of two-thirds a thickness of the conductive cap.

6. The semiconductor device according to claim 1, wherein the conductive cap includes a body portion and a surface portion covering a surface of the body portion, the body portion is formed of resin molding material, the surface portion is formed of conductive material, the conductive cap includes an outermost projection provided on an outer side surface of the conductive cap and a ceiling covering the semiconductor element, an inner side surface of the conductive cap from the inner peripheral end of the bottom surface portion has a shape in which a distance between the main surface and the inner side surface increases continuously from the inner peripheral end of the bottom surface portion toward the ceiling, in a thickness direction of the conductive cap, a distance between the bottom surface portion and the outermost projection is equal to a distance between the bottom surface portion and the ceiling, and an angle of inclination of the inner side surface toward the ceiling is equal to an angle of inclination from the outer peripheral end of the bottom surface toward the outermost projection.

7. A method of manufacturing a semiconductor device including a semiconductor element packaged on a main surface of a substrate, the method comprising:

providing a conductive bonding member to a region at an outer peripheral side of a ground pad exposed from an insulating coating member, the insulating coating member being provided to cover an inner peripheral side of the ground pad and form a step from over the ground pad to over the substrate, the ground pad being provided at a position at which the ground pad surrounds the semiconductor element on the main surface;

melting the conductive bonding member in a region at the outer peripheral side of the ground pad exposed from the insulating coating member;

mounting, on the melted conductive bonding member, a conductive cap, a bottom of the conductive cap having a bottom surface portion, the bottom surface portion having an inner peripheral end disposed at a side close to an inner peripheral side of the insulating coating member relative to an outer peripheral end of the insulating coating member, the bottom having a tapered portion in which a distance between the main surface and the tapered portion decreases continuously from an outer peripheral end of the tapered portion to the inner peripheral end of the bottom surface portion;

providing the bottom surface portion at the inner peripheral side of the bottom of the conductive cap; and providing the tapered portion at the outer peripheral side of the bottom of the conductive cap, wherein an end at an inner periphery of the tapered portion having the shape in which the distance between the main surface and the bottom decreases continuously from the outer peripheral end of the bottom toward the inner peripheral end of the bottom surface portion is disposed, in plan view, directly above a center of a region of the ground pad exposed from the insulating coating member.

8. The method according to claim 7, wherein in the mounting of the conductive cap, the substrate and the conductive cap are heated to a temperature at which the conductive bonding member does not melt, and then, the conductive cap is mounted while being pressurized.

9. The method according to claim 7, wherein in the mounting of the conductive cap, the substrate and the conductive cap are heated to a temperature at which the conductive bonding member melts, and then, the conductive cap is mounted.

10. The method according to claim 8, wherein the conductive cap is mounted so that a vertex portion of the conductive bounding member having a shape that bulges round by a surface tension contacts an end at an outer peripheral side of the bottom of the conductive cap.

* * * * *